US011963370B2

(12) United States Patent
Muzzetto et al.

(10) Patent No.: US 11,963,370 B2
(45) Date of Patent: Apr. 16, 2024

(54) ARCHITECTURE FOR MULTIDECK MEMORY ARRAYS

(71) Applicant: Micron Technology, Inc., Boise, ID (US)

(72) Inventors: Riccardo Muzzetto, Arcore (IT); Ferdinando Bedeschi, Biassono (IT); Umberto di Vincenzo, Capriate San Gervasio (IT)

(73) Assignee: Micron Technology, Inc., Boise, ID (US)

( * ) Notice: Subject to any disclaimer, the term of this patent is extended or adjusted under 35 U.S.C. 154(b) by 833 days.

(21) Appl. No.: 17/043,392

(22) PCT Filed: Mar. 3, 2020

(86) PCT No.: PCT/IB2020/000084
§ 371 (c)(1),
(2) Date: Sep. 29, 2020

(87) PCT Pub. No.: WO2021/176245
PCT Pub. Date: Sep. 10, 2021

(65) Prior Publication Data
US 2023/0104314 A1    Apr. 6, 2023

(51) Int. Cl.
*H10B 63/00* (2023.01)
*G11C 13/00* (2006.01)
*H10N 70/20* (2023.01)

(52) U.S. Cl.
CPC ......... *H10B 63/84* (2023.02); *G11C 13/0004* (2013.01); *G11C 13/003* (2013.01); *H10N 70/231* (2023.02); *G11C 2213/71* (2013.01)

(58) Field of Classification Search
None
See application file for complete search history.

(56) References Cited

U.S. PATENT DOCUMENTS 8,437,192 B2 * 5/2013 Lung ................. G11C 16/0483
365/72
10,734,057 B2    8/2020 Bedeschi
(Continued)

OTHER PUBLICATIONS

International Search Report and Written Opinion, PCT/IB2020/000084, dated Nov. 25, 2020.

*Primary Examiner* — Tan T. Nguyen
(74) *Attorney, Agent, or Firm* — Greenberg Traurig

(57) ABSTRACT

The present disclosure relates to a memory device comprising an array of memory cells arranged in a multideck configuration comprising a plurality of superimposed decks, a plurality of access lines comprising at least a first plurality of access lines arranged in a first level, a second plurality of access lines arranged in a second level, and a third plurality of access lines arranged in a third level between the first plurality of access lines and the second plurality of access lines, the third plurality of access lines being arranged between two decks of the plurality of decks, a plurality of drivers configured to drive signals to the access lines, and connection elements configured to electrically connect the access lines to the respective drivers. The connections elements and the access lines are arranged so that a single driver of the plurality of drivers is configured to drive at least one access line of each level of the at least three levels. Related memory systems and methods are also disclosed.

23 Claims, 8 Drawing Sheets

(56) References Cited

U.S. PATENT DOCUMENTS

| | | |
|---|---|---|
| 2007/0132049 A1 | 6/2007 | Stipe |
| 2012/0025386 A1 | 2/2012 | Murata |
| 2014/0254231 A1* | 9/2014 | Cernea .................. H10B 63/845 |
| | | 365/63 |
| 2018/0331114 A1 | 11/2018 | Vimercati |
| 2019/0096482 A1 | 3/2019 | Zeng et al. |
| 2019/0102104 A1 | 4/2019 | Righetti et al. |
| 2019/0181341 A1 | 6/2019 | Choi |
| 2020/0013465 A1 | 1/2020 | Sakui |
| 2020/0327935 A1* | 10/2020 | Kim ..................... G11C 13/003 |
| 2022/0084587 A1* | 3/2022 | Miyazaki ............... H10B 63/30 |
| 2022/0101909 A1* | 3/2022 | Waller .................... G11C 5/06 |

* cited by examiner

ARCHITECTURE FOR MULTIDECK MEMORY ARRAYS

The present application is a national phase application under 35 U.S.C. § 371 of International Patent Application PCT/IB2020/000084, filed on Mar. 3, 2020, the entire disclosure of which applications is hereby incorporated herein by reference.

TECHNICAL FIELD

The present disclosure relates to a memory device having an improved architecture, in particular for a multideck memory array.

BACKGROUND

Memory devices comprise a plurality of memory cells adapted to store data in the form of programmable logic states. For example, binary memory cells can be programmed into two different logic states, often denoted by a logic "1" (also referred to as "SET" state) or a logic "0" (also referred to as "RESET" state). To access the stored data, a dedicated circuit may read or sense the stored logic state in the memory device. To store data, a dedicated circuit may write or program the logic state in the memory device.

Memory devices are used in many electronic systems such as mobile phones, personal digital assistants, laptop computers, digital cameras and the like. Nonvolatile memories retain their contents when power is switched off (i.e. the memory cells are capable of retaining the stored data by maintaining their programmed logic state for extended periods of time even in the absence of an external power source), making them good choices in memory devices for storing information that is to be retrieved after a system power-cycle. Several kinds of non-volatile memory devices are known in the art, a non-exhaustive list thereof comprising read-only memory devices, flash memory devices, ferroelectric Random Access Memory (RAM) devices, magnetic memory storage devices (such as for example hard disk drives), optical memory devices (such as for example CD-ROM disks, DVD-ROM disks, Blu-ray disks), Phase Change Memory (PCM) devices.

Memory cells can include a cell stack comprising a storage element, e.g., a phase change element, in series with a select device, e.g., a switching element such as an ovonic threshold switch (OTS) or diode, between a pair of conductive lines, e.g., between an access line and a data/sense line. The memory cells are located at the intersections of two conductive lines and can be "selected" via application of appropriate voltages thereto.

Memory cells are often incorporated into three-dimensional arrangements having stacked memory array decks (i.e., tiers). However, such arrangement can be complicated due to wiring associated with each memory array deck needing to be extended to circuitry such as to wordline drivers and/or other peripheral circuitry. Moreover, the multideck arrangement is usually such that different drivers are used for different groups of access lines. It would be desirable to develop wiring arrangements (e.g., wordline/ bitline arrangements) suitable for utilization with stacked memory array decks.

DETAILED DESCRIPTION

With reference to those drawings, devices, systems and methods for an improved conductive line architecture for a multideck memory array will be disclosed herein.

In the following detailed description, numerous specific details are set forth to provide a thorough understanding of claimed subject matter. However, it will be understood by those skilled in the art that claimed subject matter may be practiced without these specific details. In other instances, methods, apparatuses and/or systems that would be known by one of ordinary skill have not been described in detail so as not to obscure claimed subject matter.

Nonvolatile memories retain their contents when power is switched off, making them good choices for storing information that is to be retrieved after a system power-cycle. A Flash memory is a type of nonvolatile memory that retains stored data and is characterized by a very fast access time. Moreover, it can be erased in blocks instead of one byte at a time. Each erasable block of memory comprises a plurality of nonvolatile memory cells arranged in a matrix of rows and columns. Each cell is coupled to an access line and/or a data line. The cells are programmed and erased by manipulating the voltages on the access and data lines.

Figure 1:
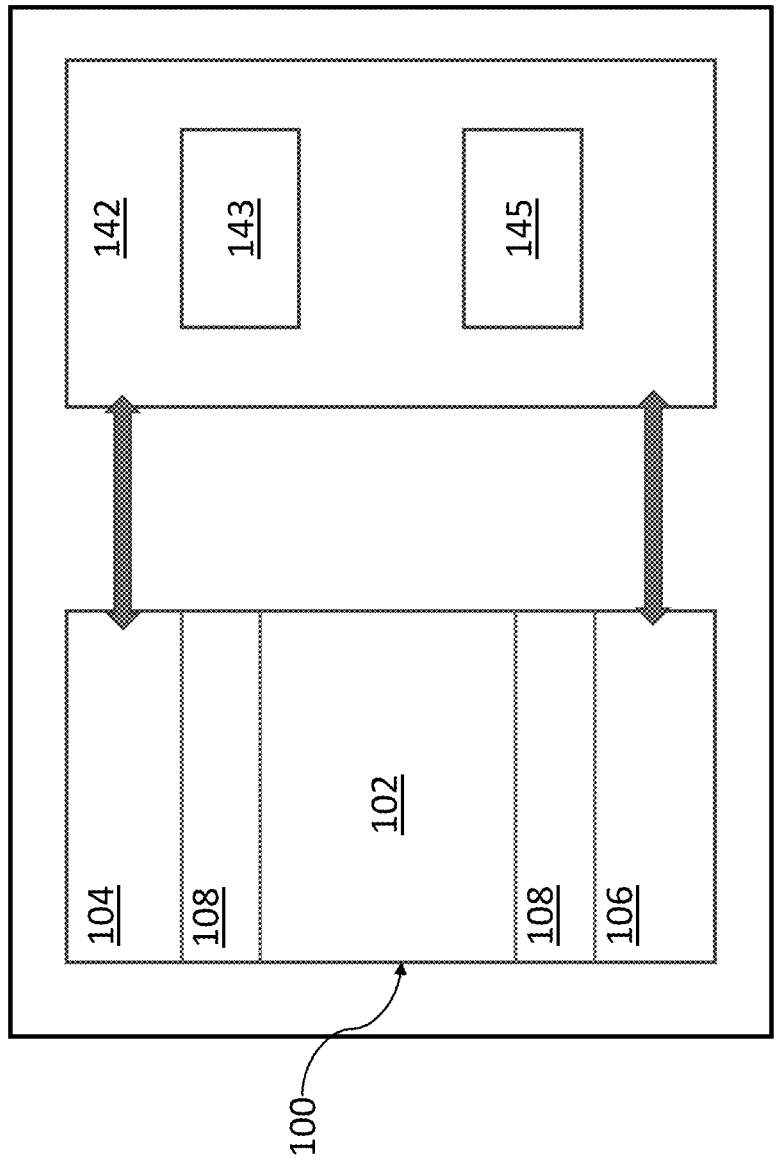
FIG. 1 is a block scheme illustrating an exemplary memory cell.

FIG. 1 illustrates a block scheme of an exemplary memory cell 100 that can be arranged in an array according to the present disclosure.

In the embodiment illustrated in FIG. 1, the memory cell 100 includes a storage material 102 between access lines 104 and 106. The access lines 104, 106 electrically couple the memory cell 100 with circuitry 142 that writes to and reads from the memory cell 100. The term "coupled" can refer to elements that are physically, electrically, and/or communicatively connected either directly or indirectly, and may be used interchangeably with the term "connected" herein. Physical coupling can include direct contact. Electrical coupling includes an interface or interconnection that allows electrical flow and/or signaling between components. Communicative coupling includes connections, including wired and wireless connections, that enable components to exchange data.

In one embodiment, the storage material 102 includes a self-selecting material that exhibits memory effects. A self-selecting material is a material that enables selection of a memory cell in an array without requiring a separate selector element. Thus, FIG. 1 illustrates the storage material 102 as a "selector/storage material." A material exhibits memory effects if circuitry for accessing memory cells can cause the material to be in one of multiple states (e.g., via a write operation), and later determine the programmed state (e.g., via a read operation). Circuitry for accessing memory cells (e.g., via read and write operations) is referred to generally as "access circuitry," and is discussed further below with reference to access circuitry 143. Access circuitry can store information in the memory cell 100 by causing the storage material 102 to be in a particular state. The storage material 102 can include, for example, a chalcogenide material such as Te—Se alloys, As—Se alloys, Ge—Te alloys, As—Se—Te alloys, Ge—As—Se alloys, Te—As—Ge alloys, Si—Ge—As—Se alloys, Si—Te—As—Ge alloys, or other material capable of functioning as both a storage element and a selector, to enable addressing a specific memory cell and determining what the state of the memory cell is. Thus, in one embodiment, the memory cell 100 is a self-selecting memory cell that includes a single layer of material that acts as both a selector element to select the memory cell and a memory element to store a logic state, i.e. a state related to a given polarity of the cell.

In one embodiment, the storage material 102 is a phase change material. A phase change material can be electrically switched between a generally amorphous and a generally crystalline state across the entire spectrum between completely amorphous and completely crystalline states. The memory cell 100 may further include a selection device (not shown) between access lines 104 and 106; the selection device may be serially coupled to the storage material 102. In another embodiment, the storage material 102 is not a phase change material. In one embodiment in which the storage material 102 is not a phase change material, the storage material is capable of switching between two or more stable states without changing phase. The access circuitry 143 is able to program the memory cell 100 by applying a voltage with a particular polarity to cause the storage material 102 to be in the desired stable state.

In one such embodiment, programming the memory cell 100 causes the memory cell 100 to "threshold" or undergo a "threshold event." When a memory cell thresholds (e.g., during a program voltage pulse), the memory cell undergoes a physical change that causes the memory cell to exhibit a certain threshold voltage in response to the application of a subsequent voltage (e.g., a read voltage with a particular magnitude and polarity). Programming the memory cell 100 can therefore involve applying a voltage of a given polarity to induce a programming threshold event, which causes the memory cell 100 to exhibit a particular threshold voltage at a subsequent reading voltage of a same or different polarity. In one such embodiment, the storage material 102 is a self-selecting material (e.g., a non-phase change chalcogenide material or other self-selecting material) that can be programmed by inducing a threshold event.

As mentioned above, the access lines 104, 106 electrically couple the memory cell 100 with circuitry 142. The access lines 104, 106 can be referred to as a bitlines and wordlines, respectively. The wordline is for accessing a particular word in a memory array and the bitline is for accessing a particular bit in the word. In one embodiment, the access lines 104, 106 can be made of one or more suitable metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicide nitrides including TiSiN and WSiN; conductive metal carbide nitrides including TiCN and WCN, or any other suitable electrically conductive material.

In one embodiment, electrodes 108 are disposed between storage material 102 and access lines 104, 106. Electrodes 108 electrically couple access lines 104, 106 with storage material 102. Electrodes 108 can be made of one or more conductive and/or semiconductive materials such as, for example: carbon (C), carbon nitride (CxNy); n-doped polysilicon and p-doped polysilicon; metals including, Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicides nitrides including TiSiN and WSiN; conductive metal carbide nitrides including TiCN and WCN; conductive metal oxides including $RuO_2$, or other suitable conductive materials.

Referring again to the circuitry 142, the access lines 104, 106 communicatively couple the circuitry 142 to the memory cell 100, in accordance with an embodiment. The circuitry 142 includes access circuitry 143 and sense circuitry 145. Circuitry includes electronic components that are electrically coupled to perform analog or logic operations on received or stored information, output information, and/or store information. Hardware logic is circuitry to perform logic operations such as logic operations involved in data processing. In one embodiment, the access circuitry 143 applies voltage pulses to the access lines 104, 106 to write to or read the memory cell 100. The terms "write" and "program" are used interchangeably to describe the act of storing information in a memory cell. To write to the memory cell 100, the access circuitry applies a voltage pulse with a particular magnitude and polarity to the access lines 104, 106, which can both select memory cell 100 and program memory cell 100.

For example, the access circuitry 143 applies a pulse with one polarity to program the memory cell 100 to be in one logic state, and applies a pulse with a different polarity to program the memory cell 100 to be in a different logic state. The access circuitry 143 can then differentiate between different logic states as a consequence of the programming polarity of a memory cell. For example, in a case of a memory read, the access circuitry 143 applies a voltage pulse with a particular magnitude and polarity to the access lines 104, 106, which results in an electrical response that the sense circuitry 145 can detect. Detecting electrical responses can include, for example, detecting one or more of: a voltage drop (e.g., a threshold voltage) across terminals of a given memory cell of the array, current through the given memory cell, and a threshold event of the given memory cell. In some cases, detecting a threshold voltage for a memory cell can include determining that the cell's threshold voltage is lower than or higher than a reference voltage, for example a read voltage. The access circuitry 143 can determine the logic state of the memory cell 100 based on electrical responses to one or more of the voltage pulses in the read sequence.

The electric current generated upon application of a reading voltage thus depends on the threshold voltage of the memory cell determined by the electrical resistance of the logic state storage element. For example, a first logic state (e.g., SET state) may correspond to a finite amount of current, whereas a second logic state (e.g., RESET state) may correspond to no current or a negligibly small current. Alternatively, a first logic state may correspond to a current higher than a current threshold, whereas a second logic state may correspond to a current lower than the current threshold.

The memory cell 100 is one example of a memory cell. Other embodiments can include memory cells having additional or different layers of material than illustrated in FIG. 1 (e.g., a thin dielectric material between the storage material and access lines and the like).

Figure 2:
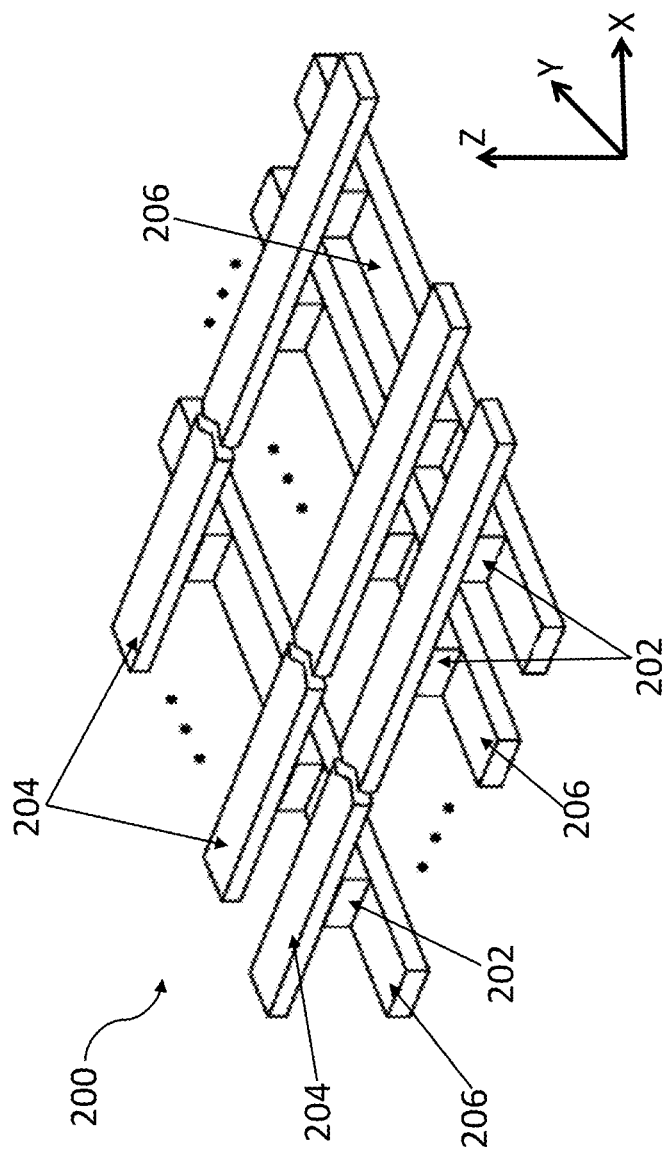
FIG. 2 schematically illustrates a portion of an exemplary memory cell array.

FIG. 2 shows a portion of a memory cell array 200, which can include a memory cell such as the memory cell 100 of FIG. 1, in accordance with an embodiment. Memory cell array 200 is an example of a three-dimensional cross-point memory structure (3D X Point). The memory cell array 200 includes a plurality of access lines 204, 206, which can be the same or similar as the access lines 104, 106 described with respect to FIG. 1. Access lines 204, 206 can be referred to as bitlines and wordlines. In the embodiment illustrated in FIG. 2, the bitlines (e.g., access lines 204) are orthogonal to the wordlines (e.g., access lines 206). A storage material 202 (such as the storage material 102 of FIG. 1) is disposed between the access lines 204, 206. As disclosed in relation to FIG. 1, storage material 202 may be a self-selecting storage material, in some examples; storage material 202 may be serially coupled to a selection device (not shown), in other examples. In one embodiment, a "cross-point" is formed at an intersection between a bitline and a wordline. A memory cell is created from the storage material 202 between the bitline and wordline where the bitline and wordline intersect. Generally speaking, the intersection defines the address of the memory cell. The storage material 202 can be a chalcogenide material such as the storage material 102 described above with respect to FIG. 1. In one embodiment, the access lines 204, 206 are made of one or more conductive materials such as the access lines 104, 106 described above with respect to FIG. 1. Although a single level or layer of memory cells is shown in FIG. 2, memory cell array 200 can include multiple levels or layers of memory cells (e.g., in the z-direction), as it will be shown in the following.

FIGS. 1 and 2 illustrate an example of a memory cell and array. Ideally, all memory cells of a memory device should feature a same (nominal) resistivity and therefore a same threshold voltage for a same logic state, wherein the threshold voltage is the voltage to be applied to the memory cells for causing them to conduct an electric current, i.e. the minimum value of the voltage that is needed to create a conducting path between the terminals, as above defined. However, since different cells programmed to a same logic state practically exhibit different resistivity values because of several factors (such as for example variations in the electrical characteristics of the phase-change material caused by the execution of a number of read-write operations and/or by manufacturing tolerances), each logic state is actually associated to a respective resistivity distribution (typically a Gaussian-type distribution), and therefore to a respective threshold voltage distribution.

In order to assess the logic state of a cell, a reading operation is carried out to assess to which threshold voltage distribution the threshold voltage of the cell belongs. For example, a reading voltage may be applied to the cell via access lines and the logic state of the cell is assessed based on (the presence or absence of) a current responsive to said reading voltage, the (presence or absence of the) current depending on the threshold voltage of the cell. A cell thresholds (e.g., it becomes conductive) when a suitable voltage difference is applied between its two terminals; such a voltage difference may be obtained in different ways, for example biasing one terminal, such as a word line terminal, to a negative voltage (e.g. a selection voltage), and the other terminal, such as a bit line terminal, to a positive voltage (e.g. a reading voltage). Other biasing configurations may produce the same effects (e.g., both the word line and the bit line terminal biased to positive voltage, or the wordline terminal biased to a reference voltage, e.g. a ground voltage, and the bitline terminal biased to a positive voltage).

In other words, operations such as reading and writing, which may be referred to as access operations, may be performed on memory cells by activating or selecting a wordline 206 and bitline 204. As known in the field, wordlines 206 may also be known as row lines, sense lines, and access lines. Bitlines 204 may also be known as digitlines, column lines, data lines, as well as access lines. References to wordlines and bitlines, or their analogues, are interchangeable without loss of understanding or operation. For example, the access lines may be wordlines and the data lines may be bitlines. Wordlines 206 and bitlines 204 may be perpendicular (or nearly perpendicular) to one another to create an array, as previously shown with reference to FIG. 2. Depending on the type of memory cell (e.g., FeRAM, RRAM, etc.), other access lines (not shown in the figures) may be present, such as plate lines, for example. It should be appreciated that the exact operation of the memory device may be altered based on the type of memory cell and/or the specific access lines used in the memory device. Activating or selecting a wordline 206 or a bitline 204 may include applying a voltage to the respective line via a dedicated driver. By activating one wordline and one bitline, a single memory cell 202 may be accessed at their intersection. Accessing the memory cell may include reading or writing the memory cell.

Accessing memory cells may be controlled through a row decoder and a column decoder (not shown). For example, a row decoder may receive a row address from a memory controller and activate the appropriate wordline based on the received row address. Similarly, a column decoder receives a column address from the memory controller and activates the appropriate bitline.

Summing up, a "cross-point" thus refers to a place where a memory cell is formed such that access lines associated with the memory cell topologically "cross" each other as access lines connect to different nodes of the memory cell. Cross-point architecture enables the theoretical minimum cell area determined by the minimum pitch of access lines.

The three-dimensional cross-point architecture allows to construct more than one "deck" of memory cells, hence a multideck memory array, which overlies support circuitry built in a substrate layer. Within the three-dimensional cross-point architecture, memory devices may be ideally subdivided into sections called memory tiles. Memory devices may be built by arranging said sections (e.g., memory tiles) in an array.

An advantage of three-dimensional cross-point memory devices is therefore the ability to "stack" multiple memory cells on top of each other, wherein each layer of memory cells is referred to as a deck. Because the memory cells are located at intersections of wordlines and bitlines, by providing additional wordlines and/or bitlines the density of the memory array can be increased. For example, for a two-deck memory array, a bitline layer can be sandwiched between two wordline layers.

Integrated circuit memory devices may therefore include multiple layers of material typically built on a substrate. The material layers include conductive metal layers, also known as metal levels or planes, which interconnect different elements. Each metal level of the memory device may include elongate conductive lines which may include wordlines and bitlines for addressing memory cells. Conductive lines formed from a layer or layers at the same vertical level can also be referred to collectively as a metal level or plane, and the individual lines can be referred to conductive/metal lines or wires even though the material may be formed from non-metal conductors such as doped semiconductor layers (e.g., polysilicon) or metallic alloys such as metal nitrides, metal carbides and metal silicides. Contacts formed between metal levels can be referred to as vertical connectors. Such vertical connectors can be formed separately from the conductive lines they connect or can be simultaneously formed with overlying conductive lines in a dual damascene process. Although different types of memory cells may be accessed, read and programmed in different manners, wordlines and bitlines are typically coupled to respective wordline and bitline driver circuitry, also known and row and column drivers.

In a multideck configuration comprising multiple metal levels, in some cases, wordlines may be shared by an upper deck and a lower deck of memory cells such that a wordline may concurrently access both memory cells in the upper deck and the lower deck. In some cases, bitlines may be common in the similar manner. In a four-deck memory array, three wordline levels or layers may be alternated with two bitline levels or layers. In some embodiments, glue layers (not shown) may be provided to carry out the connections between the array and the lower layers, such as the layers of the driver circuits (e.g. further metal layers).

Figure 3:
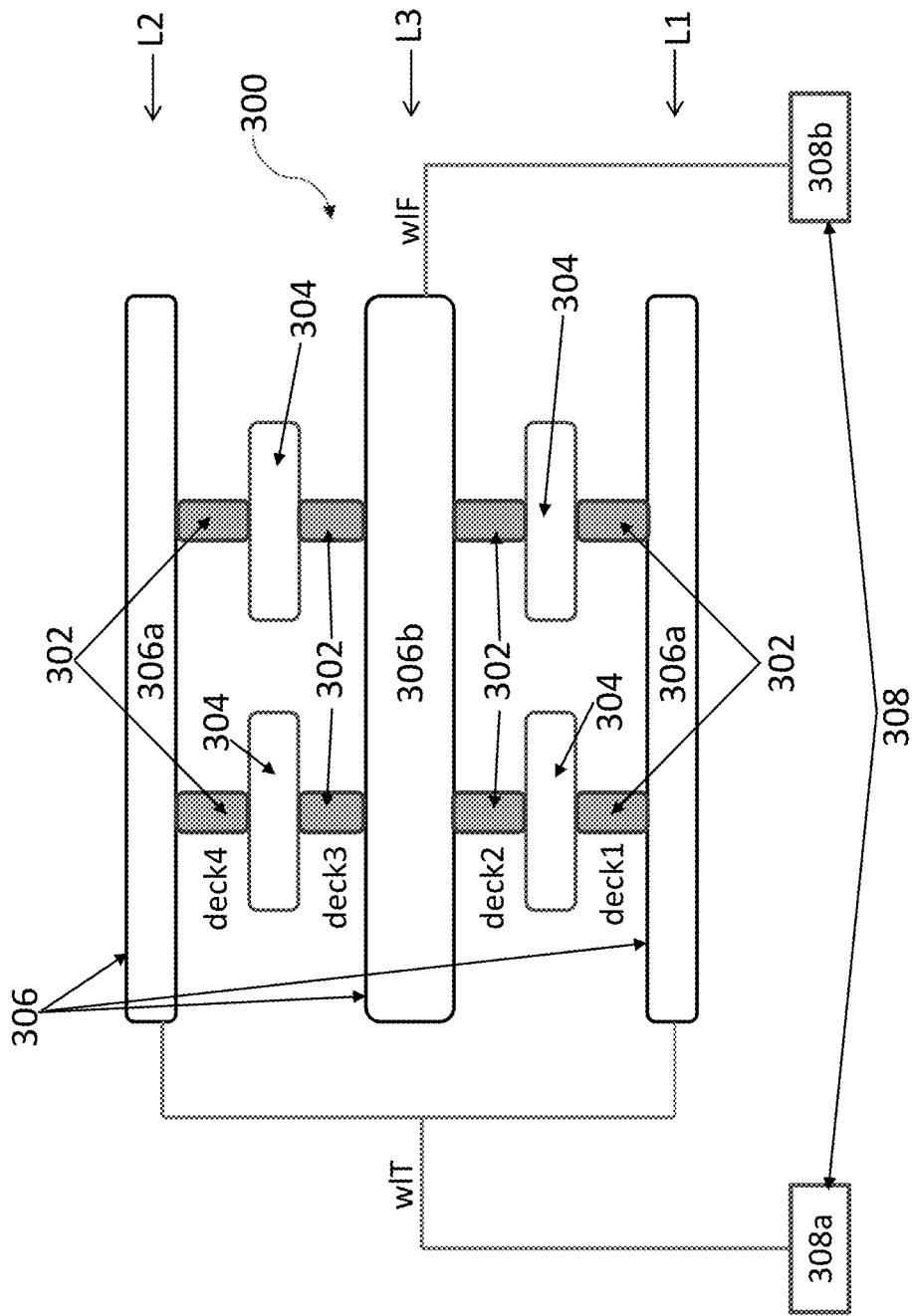
FIG. 3 schematically illustrates a four-deck configuration of a cell array.

FIG. 3 illustrates a bidimensional scheme of a three-dimensional array 300 of memory cells arranged in a multideck configuration. The figures of the present disclosure are illustrative schematic representations of various components and features of the memory array. As such, it should be appreciated that the components and feature of the memory array 300 are shown to illustrate functional inter-relationships, not their actual physical dimensions or positions within the memory array. Memory array 300 includes storage materials 302 (analogous to reference 102 and 202 of FIG. 1 and FIG. 2, respectively, hereinafter referred to also as "cells") that are programmable to store different states. Each memory cell 302 may be stacked on top of each other resulting in superimposed decks of memory cells, in particular four decks in the example of FIG. 3, even if it is to be understood that the present disclosure is not limited to a specific number of decks and other configurations are possible.

As above mentioned, the cells 302 of the array 300 are accessed via bitlines 304 and wordlines 306 and, to this purpose, such lines are connected to dedicated drivers. Bitlines 304 and wordlines 306 may be analogous to bitlines 104/204 and wordlines 106/206 of FIGS. 1 and 2, respectively. Generally, the wiring associated with each memory array deck is extended to circuitry peripheral to the memory array deck.

FIG. 3 also schematically shows the connections of the wordlines 306 to respective drivers 308. More in particular, FIG. 3 schematically shows a portion of an exemplary memory device comprising a first wordline 306a and a second wordline, also indicated as 306a, connected to driver 308a, as well as a third wordline 306b connected to driver 308b.

FIG. 3 is a bidimensional view showing only one wordline per level, even if it is to be understood that a memory device may comprise any suitable number of wordlines varying according to the needs and/or circumstances. More in particular, according to embodiments of the present disclosure, the memory device comprises a first plurality of wordlines 306a arranged on a first level L1 (e.g., a first access line level L1), a second plurality of wordlines, also indicated as 306a, arranged on a second level L2 (e.g., a second access line level L2), and a third plurality of wordlines 306b arranged on a third level L3 (e.g., a third access line level L3) between the first level L1 and the second level L2, said levels being substantially parallel to each other. Wordlines 306a are connected to driver 308a and wordlines 306b are connected to drivers 308b, those drivers being different from each other, as it will be discussed in the following.

In the embodiment of FIG. 3, the array 300 comprises four decks of memory cells stacked over each other. More in particular, the four decks 1-4 are all arranged between the first level L1 and second level L2 of wordlines 306a, those wordlines being for example in turn coupled to a substrate or to peripheral circuitry. The wordlines 306b of the third level L3 are arranged so that two decks (i.e. decks 1 and 2) are arranged on one side thereof (i.e. at the bottom) and the other two decks (i.e. decks 3 and 4) are arranged on the opposite side thereof (i.e. at the top), those wordlines 306b being configured to provide access to both decks connected to its opposite side, i.e. to both deck2 and deck3 in the example of FIG. 3. Therefore, in the embodiment of FIG. 3, the wordlines 306a of the first and second levels L1 and L2 are coupled to a single deck of cells (i.e. deck1 for the bottom wordline and deck4 for the top wordline), while wordlines 306b of the third level L3, which are a middle wordlines, are coupled to two decks on its opposite side.

In one embodiment, the wordlines 306b of the third level L3 are physically different, e.g. thicker, from the wordlines 306a of the first level L1 and of the second level L2 due to process issues. This may compensate the double leakage that the middle wordlines 306b of the third level L3 see. However, this leads to a not aligned RC, so that the middle wordlines 306b of the third level L3 have different RC from the other wordlines of the device, and different drivers for said different wordlines are therefore adopted. This drawback is solved by the configuration discussed further below with reference to FIG. 5.

In some embodiments, the top and bottom wordlines 306a may be shorted together and driven by a common driver circuit, such as driver 308a of FIG. 3. As such, in a four deck memory device, the number of wordline drivers may be doubled relative to a single deck memory device occupying the same footprint.

The memory device according to the present disclosure also comprises bitlines 304 oriented according to a direction that is orthogonal to the direction of the wordlines 306a and 306b and lying on a substantially parallel plane. In the example depicted in FIG. 3, each bitline 304 provide access to a respective pair of decks connected to its opposite side, i.e. to both deck1 and deck2 (for bitlines in a level between access lines level L1 and L3) or deck3 and deck4 (for bitlines in a level between access lines level L3 and L2). Bitlines are also driven by bitline drivers (not shown).

Figure 4:
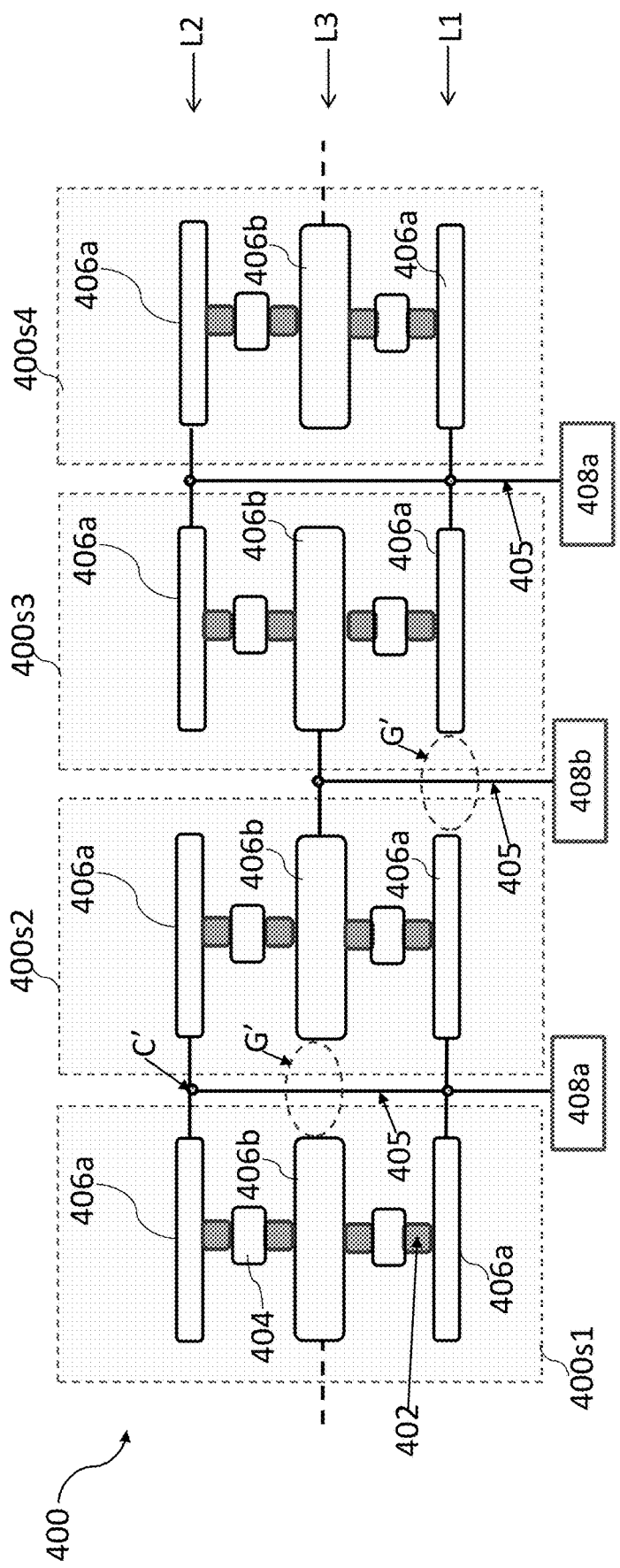
FIG. 4 schematically illustrates connections between wordlines and drivers for a multideck array, as the array of FIG. 3.

FIG. 4 schematically illustrates an array 400 (corresponding for example to the array 300 of FIG. 3), particularly showing details of the interconnections between wordlines and drivers according to known solutions. In the example of FIG. 4, several wordlines are arranged in vertically adjacent levels (e.g., adjacent access line levels), corresponding to the levels L1-L3 of FIG. 3.

More in particular, as schematically shown in FIG. 4, wordlines 406a (corresponding to the wordlines 306a of FIG. 3) of a first level L1 and of a second level L2 are different from wordlines 406b (corresponding to the wordlines 306b of FIG. 3) of a third middle level L3, so that the latter have different RC from the driver point of view and therefore different wordlines require different drivers, such as drivers 408a and 408b (corresponding for example to drivers 308a and 308b of FIG. 3).

As previously mentioned, a memory array can be partitioned into multiple sub-arrays of memory cells that are repeated in a regular fashion (also referred to as "tiles") and the drivers 408a and 408b may be distributed across a footprint of an active memory array. In this example, there are four sub-arrays 400s1, 400s2, 400s3 and 400s4. Wordline drivers 408a and 408b may be located substantially within a footprint of the active array, under the memory cells 402 (which may correspond to cells 302 of FIG. 3), and near the periphery of the sub-arrays 400s1, 400s2, 400s3 and 400s4.

As shown, wordline drivers 408a and 408b are coupled to the respective wordlines 406a and 406b. As indicated by a dot, the connection point C' between the wordlines and their drivers is positioned substantially centrally between two consecutive wordlines of a same row of a given level. For example, the connection point C' can be formed in gaps between the ends of terminated consecutive wordlines in the same level, connecting said wordlines. According to the layout of FIG. 4, in a given row of a given level, there are pairs of connected wordlines which are separated by the other pairs by gaps or spaces G', the wordlines of each pair being connected to the same driver at the connection point C'.

Moreover, a pair of connected wordlines of one level can be staggered with respect to a pair of connected wordlines of an adjacent level. In particular, in the example of FIG. 4, wordlines are staggered so that adjacent pairs of connected wordlines are shifted with respect to one another along their axis of elongation. In this configuration, all drivers are fitted under the array, sharing the same footprint as memory cells in a densely packed manner.

In the specific example of FIG. 4, wordlines 406a of the first level L1 are connected to wordlines 406a of the second level L2 by a connection element 405, which passes through the space G' defined between two consecutives and terminated (i.e. non-connected) wordlines 406b of the third level L3 interposed between the first level L1 and the second level L2. The wordlines 406a of the first and second levels L1 and L2 are then connected to the driver 408a by said connection element 405, which represents a spatial barrier for the connection of the wordlines 406b of the third level L3.

As above mentioned, the pairs of connected wordlines 406b of the third level L3 are staggered with respect to adjacent pairs of connected wordlines of adjacent levels so that gaps for housing the connection element 405 are created in the first level L1; the wordlines 406b of the third level L3 are then connected to driver 408b. In other words, the connection element 405 passes through the gap G' defined between two consecutives and terminated (i.e. non-connected) wordlines 406a of the first level L1, forming an alternated arrangement of connections of the wordline levels to the drivers 408a and 408b. The space region G' may also be called as socket region.

As shown, on same row there are pairs of connected wordlines (i.e. two wordline branches connected in series) separated by other pairs. It is also possible to develop a configuration wherein, instead of a pair of two connected wordlines, there is a single wordline connected to the driver in its central position.

It is noted that, even if FIG. 4 shows four sub arrays, this structure can be repeated for any suitable number of sub arrays and corresponding wordlines.

As previously mentioned, since the central wordlines 406b are physically different (and have a different RC) than the external wordlines 406a, two different drivers (i.e. drivers 408a for wordlines 406a and drivers 408b for wordlines 406b) should be adopted, leading to different behaviors for the two different wordline groups, which leads to time loss and difficulties to compensate wordline disturb.

Figure 5:
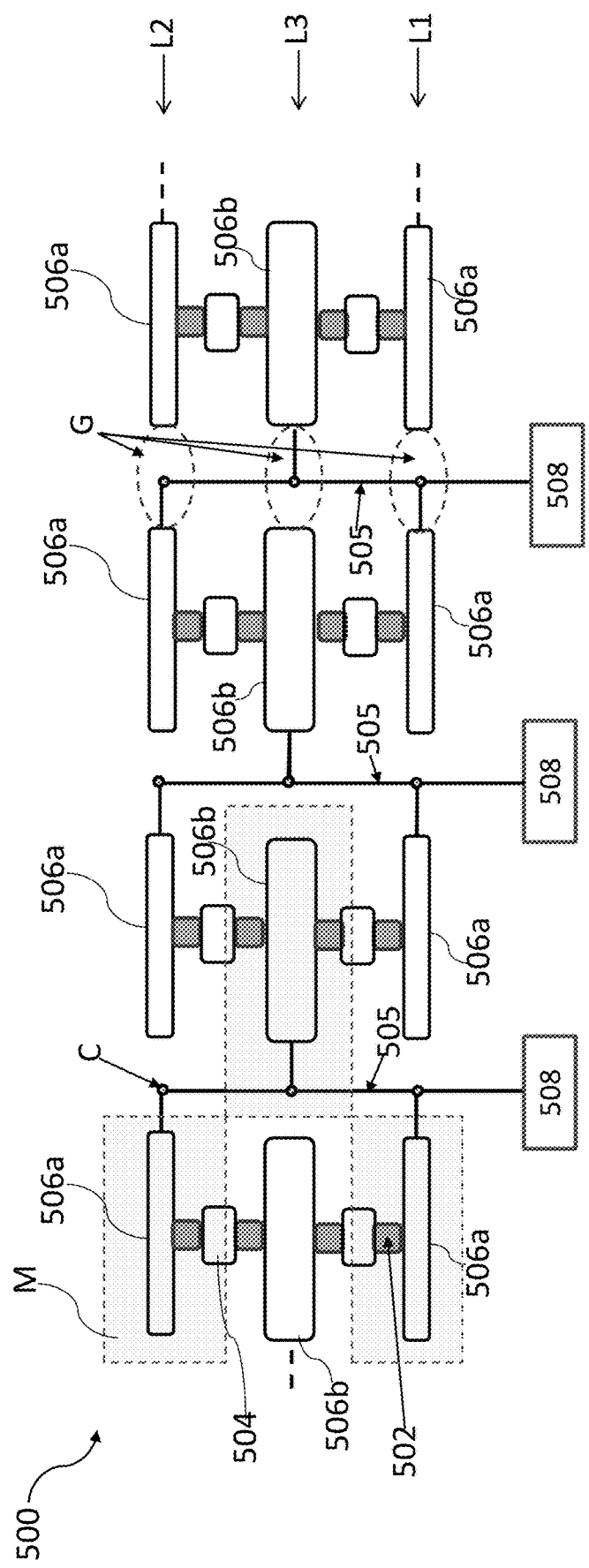
FIG. 5 schematically illustrates connections between wordlines and drivers for a multideck array according to an embodiment the present disclosure.

FIG. 5 schematically illustrates a multideck array 500, particularly showing the interconnections between wordlines and drivers, according to an embodiment of the present disclosure. As in FIG. 4, access lines of the embodiment of FIG. 5 are arranged on a plurality of adjacent levels (e.g., access line levels L1, L2 and L3) vertically superimposed, which may correspond to the levels L1-L3 of FIGS. 3 and 4. Wordlines 506a of FIG. 5 may correspond to wordlines 406a of FIG. 4 and wordlines 506b of FIG. 5 may correspond to wordlines 406b of FIG. 4.

Advantageously according to the present disclosure, access lines of adjacent levels are connected to a same driver. More in particular, as shown in FIG. 5, a same driver 508 is configured to drive at least one access line of each level of the plurality of adjacent levels, e.g., access line levels.

According to the embodiment of the present disclosure shown in FIG. 5, individual wordlines of respective adjacent levels are connected to each other and to a same driver 508 via a connection element 505, wherein all the drivers 508 of the device are substantially identical for all the wordlines of the memory device, thus solving the above-mentioned drawbacks.

As shown in FIG. 5, the connections with the connection elements 505 are formed at an end of the wordlines, and there are no pairs of connected wordlines on a same level (as instead was shown with reference to FIG. 4).

In an embodiment of the present disclosure, the wordlines in each level are arranged in substantially parallel rows, each row comprising a plurality of access lines following each other and defining gap or spaces G therebetween for housing the connection elements 505. In other words, along each row, wordline portions are separated from each other by the spaces G and connections C with the connections elements 505 are formed in said spaces G at the end of the wordlines.

More particularly, according to the embodiment of FIG. 5, the wordline layout is designed for a four-deck array, wherein the third level L3 is arranged so that two decks are arranged on top of wordlines 506b and the other two decks are arranged on bottom of said wordlines 506b, which are greater in size than the other wordlines 506a and configured to provide access to the cell decks coupled to the opposite sides thereof.

Even more particularly, according to the embodiment of FIG. 5, the wordline layout includes the first plurality of wordlines 506a arranged in the first level L1 (e.g., access line level L1), the second plurality of wordlines, also indicated by reference 506a, arranged in the second level L2 (e.g., access line level L2), and the third plurality of wordlines 506b arranged in the third level L3 (e.g., access line level L3) between the first level L1 and the second level L2, the third plurality of wordlines 506b being arranged between two decks of the plurality of decks, as previously mentioned. Advantageously, the connections elements 505 and the wordlines 506a and 506b are arranged so that a single driver of the plurality of drivers 508 is configured to drive at least one access line of each level L1-L3.

This layout balances the wordlines RC and allows to employ only one kind of driver. By connecting together one wordline of each level via a single connection element 505, such assembly of connected wordlines of different levels presents one single RC load and only one driver 508 can be connected via said connection element 505. This assembly of connected wordlines can then be repeated as modules M in the array, all said modules M having the same RC and being connected to the same kind of driver. Therefore, in other words, according to an embodiment of the present disclosure, the memory device comprises repeating modules M of access lines, each module M comprising one access line of each level, said access lines being connected to each other and to the same driver.

Moreover, in each module M, adjacent access lines are connected to opposite sides of the connection element 505, thus enabling accessing all the cells of the array without ambiguity.

More specifically, according to the embodiment of FIG. 5, each module M comprises at least one access line of the first level L1, one access line of the second level L2, and one access line of the third level L3, those access lines being connected to each other and to the same driver 508 via the connection element 505. The access lines of the first level L1 and the access lines of the second level L2 are arranged on one side of the connection element 505, whereas the access lines of the third level L3 are arranged on the opposite side of said connection element 505.

The connection elements 505 are vertical connectors formed between the wordlines and lower levels of the array. For example, in operation, electrical signals may be communicated between the wordlines and the plurality of wordline drivers 508 via the connection elements 505 through a plurality of interconnect metal levels (not shown) arranged therebetween.

The connection elements 505 are routed through the spaces G that are formed in neighboring wordlines in the same level. In the embodiment of FIG. 5, spaces G of adjacent levels are aligned with respect to each other, so that connection elements 505 may pass through all levels via said spaces G. In other words, the space G is formed in the region between ends of terminated wordlines arranged on opposite sides of said space G, which creates room for the vertical connectors 505 connecting wordlines of higher/lower metal levels.

As already shown for FIG. 4, in an embodiment, vertical elongated connectors are connected to wordlines in so-called socket regions.

All the advantages shown for the layout of FIG. 4 are still maintained in the layout of FIG. 5 according to the present disclosure, since all the drivers 504 may be located under the array by breaking up the driver groups into smaller pieces and locating connection points in a distributed manner. There is also a reduction in distance along the conductors from the connection point to the farthest cell. These benefits may be manifested in relaxed circuit complexity or process complexity, as examples.

All the above advantages are achieved together with improved performances of the device, since the non-balanced RC of wordlines is overcome by the layout of FIG. 5, comprising repeating modules of connected wordlines of each level, said modules having the same RC and being connected to a same kind of driver. Having only one driver simplifies the circuit layout of the device. Moreover, it is known that the presence of more than one kind of driver results in a probabilistic dispersion of the signals, which may have a negative impact on the device performances, such as on reading performances. The proposed solution therefore solves this drawback in multideck arrays in a simple and effective manner.

More in particular, there is only one kind driver that has to be developed, leading to relaxed complexity. The embodiments of the present disclosure also reduce the difference among the biasing of wordlines of different decks. Moreover, according to the present disclosure, all codewords have the same number of cell per every deck of the other codewords, while according to the known solutions (e.g. the solution of FIG. 3) one codeword has cells only in 1st and 4th deck and another codeword only in 2nd and 3th deck, so if a deck is worse with respect to the others, the codeword referred to that deck has higher probability error; according to the present disclosure, e.g. according to the embodiment of FIG. 5, this drawback is solved.

In a further embodiment of the present disclosure, the wordlines 506a of the second level L2 may be connected altogether, creating rows of connected wordlines in said second level L2

In a similar fashion, in some embodiments (not shown), the memory device further comprises a plurality of data line drivers configured to drive signals to the data lines and second connection elements configured to electrically connect the data lines to the respective data line drivers wherein the data line drivers are substantially identical for all the data lines of the memory device. Individual data lines of each data line level may be connected to a same data line driver. For example, a first bitline on a first data line level and a second bitline on a second data line level, different from the first data line level may be coupled to the same data line driver. In some embodiments the first bit line and the second bit line may be on opposite sides of the second connection elements. The second connection elements may be housed in spaces formed in the region between ends of terminated bitlines arranged on opposite sides of said spaces at the different data line levels. The memory device may comprise repeating modules of data lines, each data line module comprising one data line of each level, said data lines being connected to each other and to the same second driver.

Figure 6:
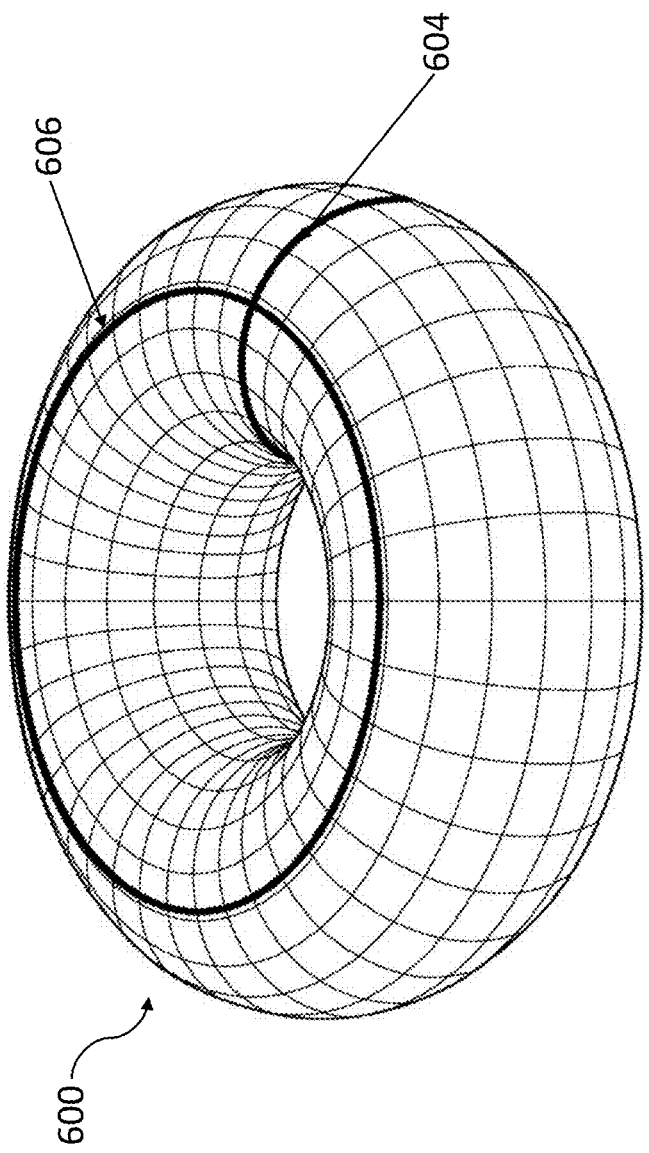
FIG. 6 is an illustration of a torus representing a relationship between memory cell locations and conductive lines that address them.

Furthermore, as shown by dashed lines in FIG. 5, the disclosed architecture of access lines leads to dangling lines at the periphery of the array. However, because the orphaned cells and drivers on one end of the array can be matched with the orphaned cells and drivers on the opposite edge of the array, the resultant connections electrically behave as if access lines on one edge of the array wrap around a cylindrical shape to address memory cells on the opposite edge of the array. The extension of access lines to connect with memory cells above adjacent tiles represents meshing of adjacent tiles, and peripheral tiles can mesh with tiles on opposite sides of the array to make a continuous mesh. Because this logical "wrap" effect applies in both dimensions of wordlines and bitlines, the array of memory cells and the conductive lines that address them can be logically represented on the surface of a torus 600 as illustrated in FIG. 6 showing a plurality of wordlines 606 and a plurality of bitlines 604. Wordline group 606 represents a collection of word line segments or portions that gets repeated for adjacent tiles. Similarly, bitline group 604 represents a collection of bitline segments or portions that gets repeated for adjacent tiles. Lines that extend outside the tiles on the upper boundary of the collection of tiles matches the lines that extend into the bottom boundary of the tiles. Similarly, lines that extend into the left boundary of a tile match the lines that extend into the right boundary of that tile. To achieve mapping of this logical toroidal surface onto the planar surface of a silicon wafer, some duplication of decoding circuits may be entailed. Any such decoding overhead can be amortized over a collection of contiguous tiles or patches.

Figure 7:
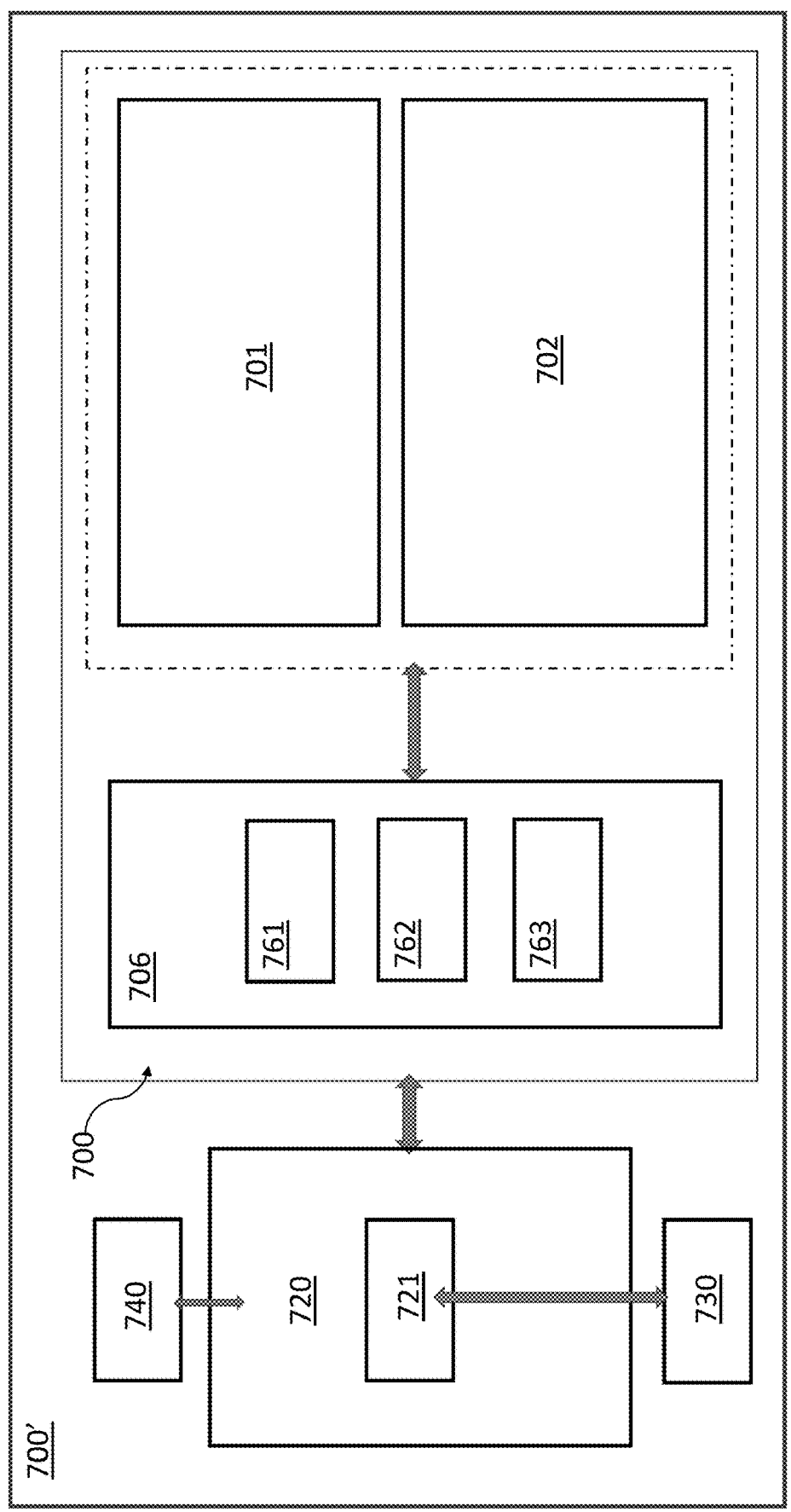
FIG. 7 shows a schematic block diagram of a system including a memory device according to the disclosure.

FIG. 7 is a high-level scheme of an electronic system 700' that includes the architecture according to the present disclosure. The system 700' includes a memory device 700, in turn including an array of memory cells 702 and a circuit portion 701 operatively coupled to the memory cells 702; the memory device 700 may include a plurality of access lines having the layout of FIG. 5, and the memory cells 702 of the memory device of FIG. 7 may correspond to the memory cells 102, 202, 302, 402 and 502 of FIGS. 1, 2, 3, 4 and 5 respectively.

In one embodiment, the circuit portion 701 includes access circuitry as well as sense circuitry to detect electrical responses of the one or more memory cells. In one embodiment, the sense circuitry includes sense amplifiers. In one embodiment, the circuit portion 701 includes one or more registers. Furthermore, in one embodiment, the circuit portion 701 includes also decode circuitry.

The memory device 700 comprises a memory controller 706, which represents control logic that generates memory access commands, for example in response to command by a host 720. The memory controller 706 accesses the memory cells 702. In one embodiment, the memory controller 706, which is operatively coupled with a host processor 721, can also be implemented in the host 720, in particular as part of the host processor 721, even if the present disclosure is not limited by a particular architecture. Memory controller 706 may generate row and column address signals in order to activate the desired wordline and bitline, as previously disclosed. Memory controller 706 may also generate and control various voltages or currents used during the operation of memory array. For example, it may apply discharge voltages to a wordline or bitline after accessing one or more memory cells.

Multiple signal lines couple the memory controller 706 with the memory cells 702 and with the logic circuit portion 701. For example, such signal lines may include clock, command/address and write data (DQ), read DQ, and zero or more other signal lines. The memory controller 706 is thus operatively coupled via suitable buses to the memory portion of the device.

The memory cells 702 represent the memory resource for the system 700'. In one embodiment, the array of memory cells 702 is managed as rows of data, accessed via wordline (rows) and bitline (individual bits within a row) control. In one embodiment, the array 702 of memory cells includes a 3D crosspoint array such as the memory cell array 200 of FIG. 2. The array 702 of memory cells can be organized as separate channels, ranks, and banks of memory.

In one embodiment, the memory controller 706 includes refresh logic 761. In one embodiment, refresh logic 761 indicates a location for refresh, and a type of refresh to perform. Refresh logic 761 can trigger self-refresh within memory, and issue external refreshes by sending refresh commands to trigger the execution of a refresh operation.

In the exemplary embodiment illustrated in FIG. 7, the memory controller 706 also includes error detection/correction circuitry 762. The error detection/correction circuitry 762 can include hardware logic to implement an error correction code (ECC) to detect errors occurring in data read from memory portion. In one embodiment, error detection/correction circuitry 762 also corrects errors (up to a certain error rate based on the implemented ECC code). However, in other embodiments, error detection/correction circuitry 762 only detects but does not correct errors.

In the illustrated embodiment, the memory controller 706 includes command (CMD) logic 763, which represents logic or circuitry to generate commands to send to logic circuit portion 701 and to the memory cells 702. Clearly, also other architectures can be employed.

The memory device 700 is operatively coupled with the host device 720, for example via the controller 706. The host device 720 represents a computing device in accordance with any embodiment described herein, and can be a laptop computer, a desktop computer, a server, a gaming or entertainment control system, a scanner, copier, printer, routing or switching device, embedded computing device, or other electronic device such as a smartphone. In a preferred embodiment of the present disclosure, the host 720 is a mobile phone. The memory device 700 may also be embedded in the host device 720.

In one embodiment, the system 700' includes an interface 730 coupled to the processor 721, which can represent a high-speed interface or a high throughput interface for system components that needs higher bandwidth connections, and/or graphics interface components. Graphics interface interfaces to graphics components for providing a visual display to a user of system 700. In one embodiment, graphics interface generates a display based on data stored in the memory device or based on operations executed by processor or both. The system 700' may also comprise network interface 740 communicatively coupled to the host or to memory device for example for connecting with other systems, and/or a battery coupled to provide power to said system. In other words, the system 700' may further comprise a communication module is configured to enable communications with other electronic systems, and/or interface devices configured to enable interface of a user.

Figure 8:
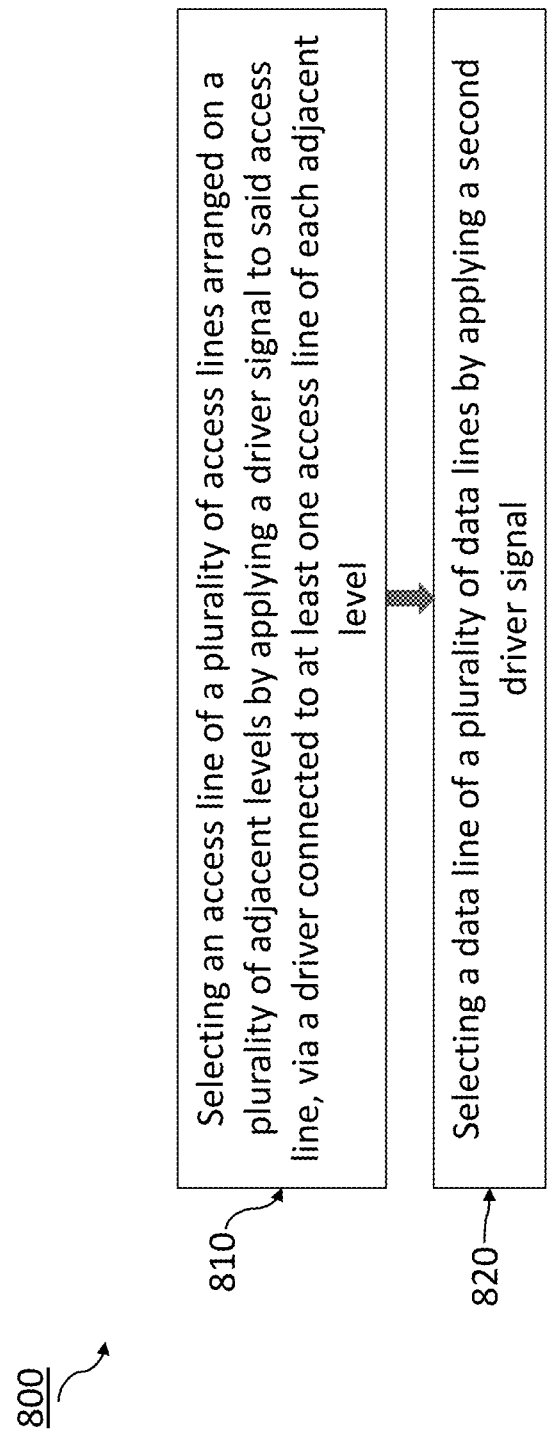
FIG. 8 is a flow diagram representing steps of a method according to the present disclosure.

With reference now to FIG. 8, the present disclosure also refers to a method for accessing memory cells arranged in a multideck configuration, such as the multideck configuration of FIG. 5, the method comprising at least the step (810) of selecting an access line of a plurality of access lines arranged on a plurality of adjacent levels by applying a driver signal to said access line.

The application of the driver signal comprises applying said signal via a driver connected to one access line of each adjacent level (e.g., access lines levels). Advantageously according to the present disclosure, the driver signal is equal for all the access lines. Access line selection may be carried out according to the solutions described with reference to FIGS. 1, 2 and 5. In some embodiments a controller as described in FIG. 7 may oversee access line selection.

The method to access the desired cell also comprises a step (820) of selecting a data line of a plurality of data lines by applying a second driver signal. The second signal may be applied to the data line via a second driver, e.g., a data line driver, coupled to the data line. Data line selection may be carried out according to the solutions described with reference to FIGS. 1, 2 and 5. In some embodiments a controller as described in FIG. 7 may oversee data line selection.

In conclusion, the present disclosure provides a layout solution to balance the wordline load RC and allows to develop only one wordline driver. This has been shown to be particularly advantageous in a cross point four decks architecture, even if the benefits of the present disclosure can be applied to various architectures.

More in particular, an example memory device comprises an array of memory cells arranged in a multideck configuration comprising a plurality of superimposed decks, a plurality of access lines arranged on a plurality of adjacent superimposed levels, a plurality of drivers configured to drive signals to the access lines, and connection elements configured to electrically connect the access lines to the respective drivers, wherein access lines belonging to adjacent levels are connected to a same driver.

Moreover, an example memory devices comprises an array of memory cells arranged in a multideck configuration comprising a plurality of superimposed decks, a plurality of access lines comprising at least a first plurality of access lines arranged in a first level, a second plurality of access lines arranged in a second level, and a third plurality of access lines arranged in a third level between the first plurality of access lines and the second plurality of access lines, the third plurality of access lines being arranged between two decks of the plurality of decks, a plurality of drivers configured to drive signals to the access lines, and connection elements configured to electrically connect the access lines to the respective drivers, wherein the connections elements and the access lines are arranged so that a single driver of the plurality of drivers is configured to drive at least one access line of each level of the at least three levels.

In an embodiment, the drivers are advantageously substantially identical for all the access lines of the memory device. An exemplary related electronic system and exemplary related method are also disclosed.

In the preceding detailed description, reference is made to the accompanying drawings that form a part hereof, and in which is shown, by way of illustration, specific examples. In the drawings, like numerals describe substantially similar components throughout the several views. Other examples may be utilized, and structural, logical and/or electrical changes may be made without departing from the scope of the present disclosure. In addition, as will be appreciated, the proportion and the relative scale of the elements provided in the figures are intended to illustrate the embodiments of the present disclosure and should not be taken in a limiting sense.

As used herein, "a," "an," or "a number of" something can refer to one or more of such things. A "plurality" of something intends two or more. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship). Typically, "or" if used to associate a list, such as A, B or C, is intended to encompass A, B, and C, here used in the inclusive sense, as well as A, B or C, here used in the exclusive sense. In addition, the term "one or more" as used herein may be used to describe any feature, structure, or characteristic in the singular or may be used to describe a plurality or some other combination of features, structures or characteristics. Though, it should be noted that this is merely an illustrative example and claimed subject matter is not limited to this example.

Although specific examples have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is thus to be understood that the above description has been made in an illustrative fashion, and not a restrictive one. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein. The scope of one or more examples of the present disclosure should be determined with reference to the appended claims, along with the full range of equivalents to which such claims are entitled.

The invention claimed is:

1. A memory device comprising:
an array of memory cells arranged in a plurality of decks;
a plurality of access lines arranged on a plurality of levels;
a plurality of drivers configured to drive signals to the access lines; and
connection elements configured to electrically connect the access lines to the respective drivers, wherein access lines of adjacent levels of the plurality of levels have different characteristics and are connected to a same driver.

2. The memory device according to claim 1, wherein the drivers are substantially identical for all the access lines of the memory device, and wherein individual access lines of each adjacent level are connected to a same driver.

3. The memory device of claim 1, wherein the access lines of each level are arranged in substantially parallel rows, each row comprising a plurality of access lines following each other and defining spaces therebetween for housing the connection elements.

4. The memory device of claim 3, comprising repeating modules of access lines, each module comprising one access line of each level, said one access line of each level being connected to each other and to a same driver.

5. The memory device of claim 4, wherein, in each module, access lines on adjacent levels are connected to opposite sides of the connection element.

6. The memory device of claim 1, wherein the driver signal is applied via the connection element at an end of the access line.

7. The memory device of claim 1, comprising data lines oriented according to a direction that is orthogonal to the direction of the access lines, the data lines arranged on a plurality of data line levels wherein a data line level is between adjacent access line levels.

8. The memory device of claim 7 further comprising:
a plurality of data line drivers configured to drive signals to the data lines; and
second connection elements configured to electrically connect the data lines to the respective data line drivers.

9. The memory device of claim 8 wherein the data line drivers are substantially identical for all the data lines of the memory device, and wherein individual data lines of each data line level are connected to a same data line driver.

10. The memory device of claim 1, wherein the memory cells are arranged in a cross-point configuration.

11. The memory device of claim 1, wherein memory cells of the array comprise a storage element material comprising at least one of a chalcogenide material and a phase change material.

12. The memory device of claim 1, comprising a first level of access lines, a second level of access lines identical to the access lines of the first level, and a third level of access lines arranged between the first level and second level of access lines, the access lines of said third level being thicker than the access lines of first level and of second level.

13. A memory device comprising:
an array of memory cells arranged in a plurality of decks;

a plurality of access lines comprising at least a first plurality of access lines arranged in a first level, a second plurality of access lines arranged in a second level, and a third plurality of access lines arranged in a third level between the first level and the second level, the third plurality of access lines being arranged between two decks of the plurality of decks;

a plurality of drivers configured to drive signals to the access lines; and connection elements configured to electrically connect the access lines to the respective drivers;

wherein the connections elements and the access lines are arranged so that a single driver of the plurality of drivers is configured to drive at least one access line of each level of the at least three levels, and wherein the drivers of the plurality of drivers are substantially identical.

14. The memory device of claim 13, wherein the access lines of each level are arranged in substantially parallel rows, each row comprising a plurality of access lines following each other and defining spaces therebetween for housing the connection elements.

15. The memory device of claim 13, comprising repeating modules of access lines, each module comprising at least one access line of the first level, one access line of the second level, and one access line of the third level, said at least three access lines being connected to each other and to the same driver.

16. The memory device of claim 15, wherein, in each module, the access lines of the first level and the access lines of the second level are arranged on one side of the connection element, and wherein the access lines of the third level are arranged on the opposite side of said connection element.

17. The memory device of claim 13, comprising four decks of memory cells stacked over each other, wherein said four decks are all arranged between the first and the second levels of access lines, and wherein the third level of access lines is arranged so that two decks are disposed on top thereof and the other two decks are arranged on bottom thereof, the access lines of said third level being configured to provide access to decks coupled to opposite side thereof.

18. The memory device of claim 17, wherein the first plurality of access lines is identical to the second plurality of access lines, and wherein the third plurality of access lines is thicker than the first and second pluralities of access lines.

19. The memory device of claim 13, wherein the driver signal is applied via the connection element at an end of the access line.

20. The memory device of claim 13, comprising data lines oriented according to a direction that is orthogonal to the direction of the access lines.

21. The memory device of claim 20, wherein the plurality of data lines is arranged on a plurality of data line levels, a data line level between adjacent levels of the first, the second and the third level, the memory device further comprising:

a plurality of data line drivers configured to drive signals to the data lines; and second connection elements configured to electrically connect the data lines to the respective data line drivers.

22. The memory device of claim 21 wherein the data line drivers are substantially identical for all the data lines of the memory device, and wherein individual data lines of each data line level are connected to a same data line driver.

23. The memory device of claim 13, wherein the memory cells are arranged in a cross-point configuration.

* * * * *